United States Patent [19]

Farber et al.

[11] Patent Number: 5,017,910
[45] Date of Patent: May 21, 1991

[54] INTERMITTENT FAULT DETECTION SYSTEM

[75] Inventors: Arnold S. Farber, Cedar Falls; Stephen P. Lang; David C. Smart, both of Waterloo, all of Iowa

[73] Assignee: Deere & Company, Moline, Ill.

[21] Appl. No.: 397,820

[22] Filed: Aug. 24, 1989

[51] Int. Cl.$^5$ .............................................. G08B 21/00
[52] U.S. Cl. .................................... 340/635; 324/647
[58] Field of Search ............... 340/635, 657, 647, 650, 340/651; 364/900; 324/539, 540, 542

[56] References Cited

U.S. PATENT DOCUMENTS

| | | | |
|---|---|---|---|
| 3,183,435 | 5/1965 | Donville et al. | 324/539 |
| 3,699,432 | 10/1972 | Brown | 324/540 X |
| 3,868,626 | 2/1975 | Masher | 340/939 |
| 4,295,363 | 10/1981 | Buck et al. | |
| 4,337,515 | 6/1982 | Kreft . | |
| 4,373,186 | 2/1983 | Marshall et al. . | |
| 4,402,217 | 9/1983 | Higashiyama . | |
| 4,497,057 | 1/1985 | Kato et al. . | |
| 4,621,335 | 11/1986 | Bluish et al. | 340/945 X |
| 4,736,626 | 4/1988 | Mizuno et al. . | |
| 4,747,301 | 5/1988 | Bellanger . | |
| 4,748,566 | 5/1988 | Sasaki et al. . | |
| 4,780,826 | 10/1988 | Nakano et al. . | |
| 4,783,991 | 11/1988 | Wixon . | |
| 4,791,359 | 12/1988 | Raymond et al. . | |

OTHER PUBLICATIONS

ASAE Paper No. 86-1090, Ellis et al., "Electronic Instrumentation for World Agricultural Tractors", 1986.
John Deere TM-1259, "Investigator II Warning System", 1983, pp. 240-10-69, 240-10-80 and 86.

*Primary Examiner*—Joseph A. Orsino
*Assistant Examiner*—Jeffery A. Hofsass

[57] ABSTRACT

A monitoring or control system includes a plurality of senders or sensors which are coupled to a central control unit by separate cables. The control unit includes a microprocessor which executes an intermittent fault detection algorithm while an operator manually flexes each cable in turn. When a cable with a fault is manipulated the algorithm responds by energizing a horn.

2 Claims, 2 Drawing Sheets

INTERMITTENT FAULT DETECTION SYSTEM

BACKGROUND

This invention relates to an electrical monitoring system and more particularly to diagnosing intermittent electrical faults which can occur in such a system.

Electrical monitoring and/or control systems are well known in the prior art. Such systems typically include sensor or sending devices coupled to a central processing or control unit via electrical cables or conductors. Intermittent faults, such as short or open circuit conditions in such cables and or connectors have always been difficult to isolate. For example, the fault may not occur when a service person is present, or it may disappear as the service person takes diagnostic action. Accordingly, it would be desirable to have a monitoring or control system with a built-in capability for facilitating detection and isolation of such intermittent faults.

SUMMARY

An object of the present invention is to provide an electrical monitoring and/or control system with a system for detecting and isolating intermittent faults.

These objects are achieved by the present invention wherein a plurality of sensors or senders are coupled by electrical cables or conductors to a central electrical processing or control circuit which includes a microprocessor. Actuation of a switch places the microprocessor in a mode wherein a special intermittent fault detection algorithm is repetitively executed while the service person flexes each of the cables, one after the other. Whenever the intermittent fault becomes active it will cause a change in the voltage or current in that cable and the fault detection algorithm will automatically energize an audible horn.

BRIEF DESCRIPTION

DETAILED DESCRIPTION

Figure 1:
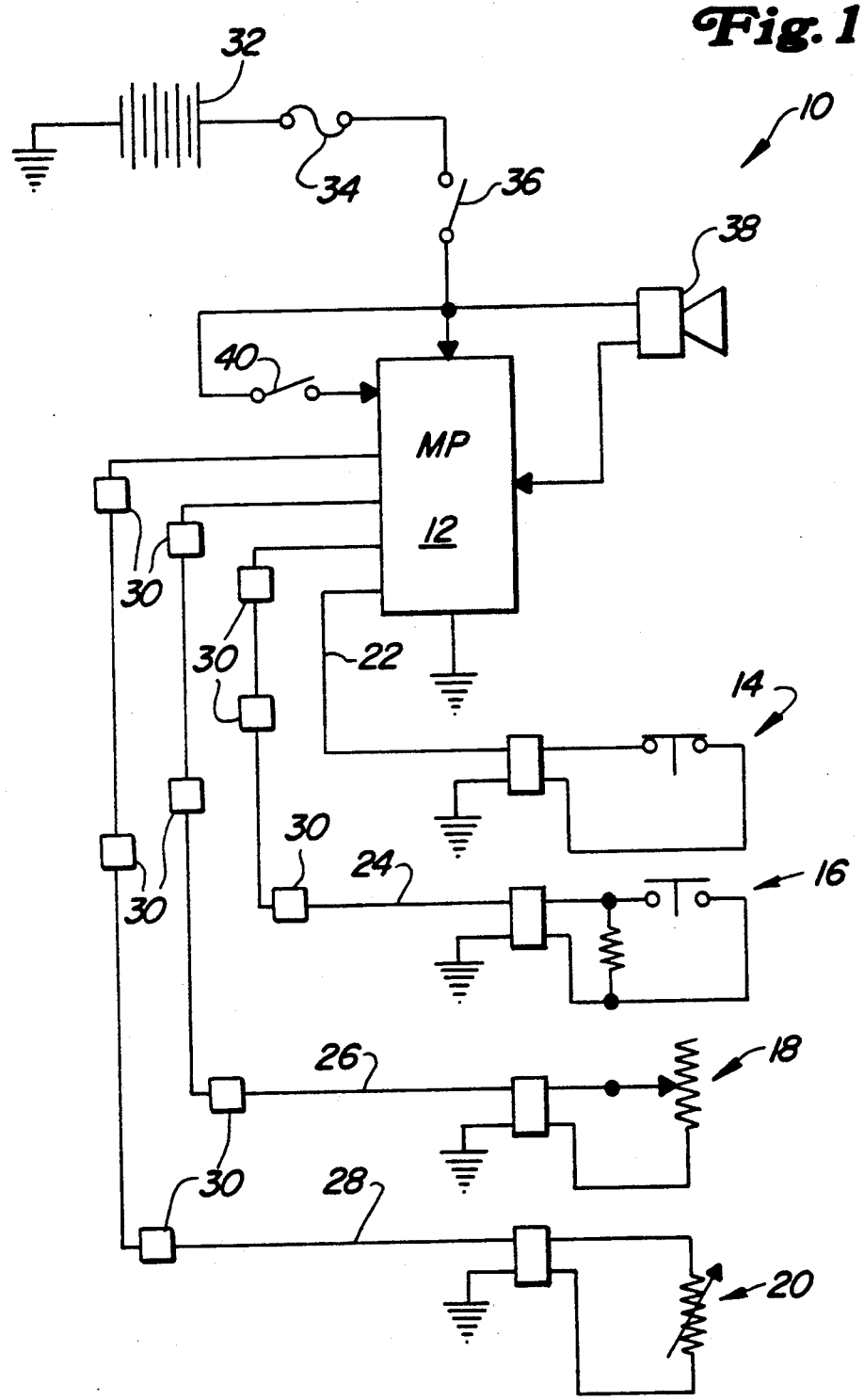
FIG. 1 is a simplified schematic diagram of a monitoring system including the intermittent fault detection feature of the present invention.

A monitoring and/or control system 10 includes a control or processing unit 12 which is coupled to a plurality of sensors or sending devices, such as a normally closed switch 14, a normally open switch 16, a potentiometer type analog sensor 18 and a variable resistance analog sensor 20. Each device is coupled to the central unit 12 via a corresponding conductor or cable 22, 24, 26, and 28. Each cable may include one or more connectors 30.

The central unit 12 is connected to a potential source or battery 32 via a fuse 34 and a switch 36, such as the ignition switch in the case of a vehicle. An alarm device 38, such as an audible horn is connected to an output terminal of the central unit 12 and to the switch 36. An operator controlled mode control switch 40 is connected between the switch 36 and a mode control input of the central unit 12.

The central unit 12 includes a conventional microprocessor which may be programmed to monitor the functions sensed by devices 14-20 and/or to control various functions (not shown) in response to sensed parameters. Such monitoring and/or control functions form no part of the present invention.

Figure 2:
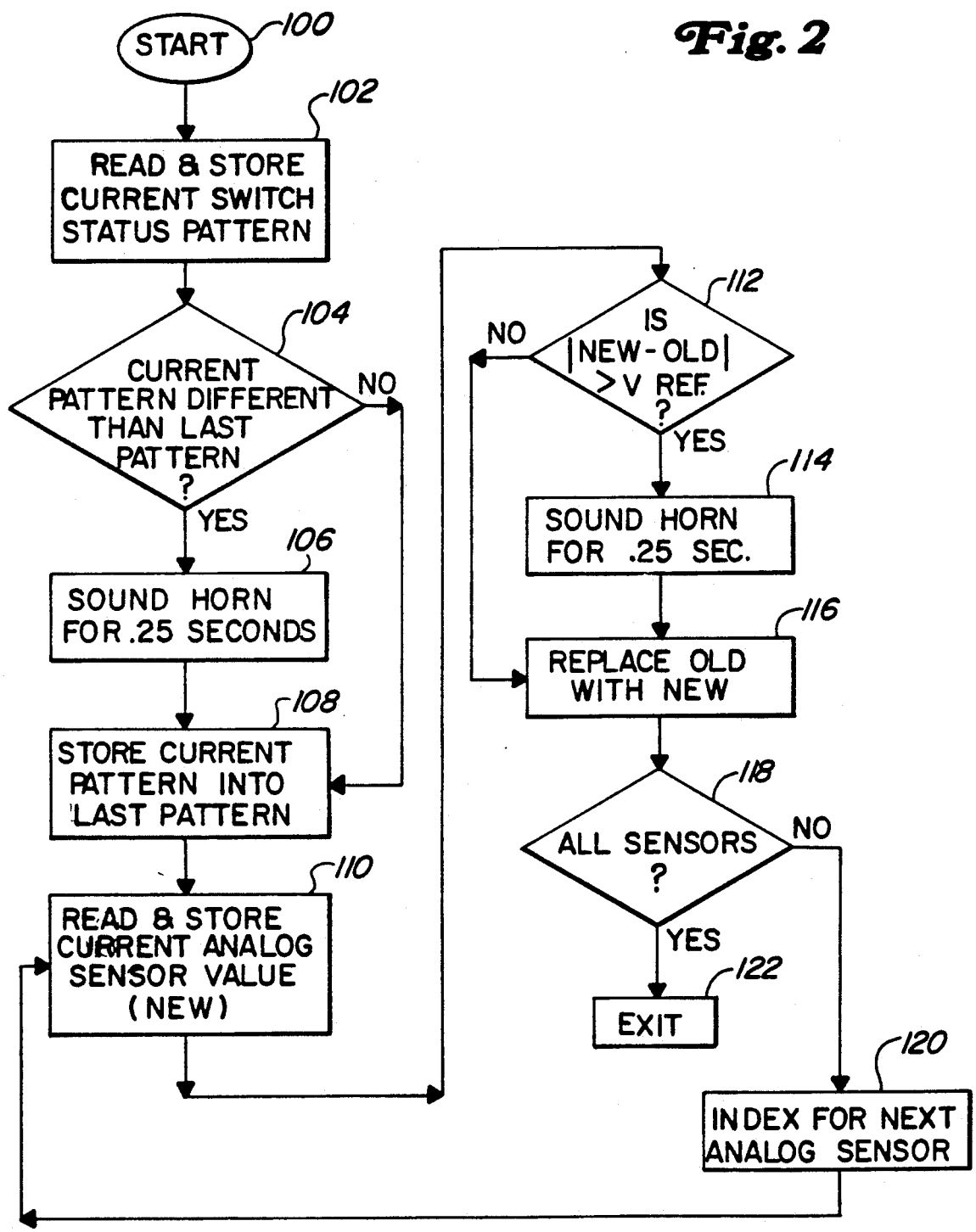
FIG. 2 is a logic flow diagram of an algorithm or compute executed by the central control unit of FIG. 1.

According to the present invention, the central unit 12 also executes a diagnostic algorithm which is enabled when switch 40 is manually closed and which will be described with reference to the logic flow diagram of FIG. 2.

The algorithm begins at step 100 which is entered periodically, such as 32 times per second, as long as the switch 40 remains closed. Then, at step 102, a set of status signals for the plurality of switches 14 and 16, as represented by electrical parameters communicated via cables 22 and 24, are read and stored in memory. Then in step 104, the current set of status signals is compared to an initial set or to a previously stored set of status signals and if these sets differ, then the algorithm is directed to step 106 which causes the horn 38 to sound for a certain desired period. If the compared sets are the same, then the algorithm proceeds to step 108 which stores the current set of status signals into a set of last pattern memory locations.

Then in step 110, a current status signal for a first one of the analog sensors 18, 20 is read and stored. In step 112, the absolute value of the difference between the current status value and an initial or previously stored status value for this sensor is compared to a reference value. If the absolute value of this difference is more than the reference amount, Vref, then step 114 causes the horn 38 to sound for a desired interval. Otherwise, the algorithm proceeds to step 116 which replaces the initial or previously stored status signal with the current status value. If status signals for all the analog sensors have not yet been analyzed, then step 120 changes an index value and returns the algorithm to step 110 so that steps 110–116 will be repeated for each analog sensor in sequence. After the status signals for all the analog sensors have been analyzed, step 118 directs the algorithm to step 122 which terminates operation of this cycle of the algorithm.

Thus, with the present invention, if an intermittent fault in one of the cables or connectors is suspected, the operator can close switch 40 and manually flex each cable, one after the other. If such a fault exists, then the corresponding status signal will change from one cycle of the algorithm to the next and the algorithm will respond by sounding the horn 38. In this manner, intermittent faults in cables and connectors can be detected and isolated. In the case of a sending unit such as normally open switch 16, the switch should be removed and replaced by a jumper so that current can flow through cable 24 and so that manipulation of cable 24 will cause a change in the voltage or current sensed by the central control unit 12.

For more detailed information concerning this algorithm, reference is hereby made to the following annotated assembly language computer program listing description. In view of the above-described flow chart, and in view of the assembly language program listing included herein, it will be evident to those skilled in the art to implement the invention described herein in a monitoring or control system which includes a data processor, such as a microprocessor.

While the invention has been described in conjunction with a specific embodiment, it is to be understood that many alternatives, modifications and variations will be apparent to those skilled in the art in light of the aforegoing description. Accordingly, this invention is intended to embrace all such alternatives, modifications and variations which fall within the spirit and scope of the appended claims.

! This is part of the program that executes 64 times / second.
! The switch 'SENSOR' inputs are scanned at that rate.
! The 'Analog to Digital STUFF' occurs 64 times / second, but each time it
! only does half of them, so the net rate is 32 times / second.

```
*\ Events that occur 64 times per second
per64   brclr   timing,#fnc64p,1$       > not time yet
        bclr    timing,#fnc64p

* Display test operates concurrently                                    *
        tst     dspctr
        beq     7$              / if NOT in display test, EXIT.      [3]
        jsr     dsptst          continue with display test until done
7$
        jsr     sensor          [e] read all the switch sensor inputs
        brclr   adctl,x,#bit7,1$        not scheduled                [6]
        jsr     adstff          [e] [6]+[135] xfr 4 byte packet     [141]
1$
*/
```

! 64 times / second, this subroutine is executed that reads 4 of the analog
! sensor values and checks to see if the tachometer is currently in BEEP MODE.
! If it is, then it branches down to another subroutine CHKBEP to compute
! the absolute of 'current' value - 'last' value and compare to the reference
! value 'differ'(ence) to see if the .25 second 'BEPDLY+1' needs to be put in
! the 'BEePTiMeR'. Every other entry to this routine it does the same thing
! with the other 4 analog sensor values.

```
****************************************************************
*               Analog channel service routine                  *
****************************************************************
* Entry:        don't care                                      *
* Exit:         A,B,X,Y modified                                *
*               4 channels of analog data updated               *
*               depending upon which conversion took place.     *
* Time:         132                                             *
* subroutines:  genmuv                                          *
* Stack levels: 5                                               *
****************************************************************
ADSTFF  brclr   prgflg,#inproc+vlreq+hrreq+clreq+pgreq,1$
        rts             if eerom busy/pending, exit and come back soon 1$      LDX     #regseg                                                 [3]
        BRSET   ADCTL,X,#BIT2,ADCC_1    have done channels 4 - 7        [6]
        PSHX                    \                                       [4]<2>
        LDX     #regseg+ADR1    : block move                            [3]
        LDY     #adh2ot         :                                       [3]
*\ Beep mode
        brclr   dspflg,#bepbit,9$       if not beep mode 2$      ldaa    0,x             get coolant value
        suba    0,y             new - old
        bsr     chkbep
        ldaa    1,x             get oil temp
        suba    1,y
        bsr     chkbep
```

```
            ldaa    3,x              eng oil pres
            suba    3,y
            bsr     chkbep
*/
9$          ldab    #4               :                                      [2]
            jsr     genmuv           :                                      [95]<2>
            pulx                     /                                      [5]
            bset    calc,#batclc     compute corrected system volts.
            bset    adctl,x,#bit2    select the upper 4 channels            [6]
            rts                                                             [5]

adcc_1      pshx                     \                                      [4]<2>
            ldx     #regseg+adr1     : block move                           [3]
            ldy     #adhazz          :                                      [3]
*\ Beep mode
            brclr   dspflg,#bepbit,9$        if not beep mode 2$          ldaa    2,x              get lube pres value
            suba    2,y
            bsr     chkbep ldaa    3,x              get fuel value
            suba    3,y              new - old
            bsr     chkbep
*/
9$          ldab    #4               :                                      [2]
            jsr     genmuv           :                                      [95]<2>
            pulx                     /                                      [5]
            bclr    adctl,x,#bit2    >  SELECT THE LOWER 4 CHANNELS         [6]
            rts                                                             [5]

* Check the value in a for the need to BEEP                                 *
chkbep      bpl     2$
            coma
2$          cmpa    differ           if it changed more than this much
            blo     9$                      cause a beep
            ldaa    #bepdly+1
            staa    beptmr
9$          rts
```

45
! For the switch sensors that use a normally closed switch, or for the
! normally open switches that have been replaced with a jumper, this is
! basically the same function as for the analog.
! Here, because these sensors can only be 'on' or 'off', all it looks for
! is a changes from one state to the other.

```
*****************************************************************************
* Sensor Status- read all switch inputs, and put in ram for access           *
*****************************************************************************
* Entry:        64 times / second                                            *
*               all switch type of inputs (as listed below) are read         *
*               and placed into internal ram for access by other             *
*               routines.                                                    *
* Exit:         status is updated. if status <> status(T-1),                 *
*               a ccd send request is initiated.                             *
* Time:         119/125 cycles                                               *
```

```
*****************************************************************
*byte 1 bits    7 6 5 4 3 2 1 0
*               ! ! ! ! ! ! ! +  hazard input active (1)
*               ! ! ! ! ! ! +--  right turn signal active (1)
*               ! ! ! ! ! +----  left turn signal active (1)
*               ! ! ! ! +------  backlites active (1)
*               ! ! ! +--------  undefined
*               ! ! +----------  undefined
*               ! +------------  diagnostic active (1)
*               +--------------  metric mode (1)
*byte 2 bits    7 6 5 4 3 2 1 0
*               ! ! ! ! ! ! ! +  undefined
*               ! ! ! ! ! ! +--  undefined
*               ! ! ! ! ! +----  undefined
*               ! ! ! ! +------  engine oil pressure (1)
*               ! ! ! +--------  air filter (1)
*               ! ! +----------  hyd lube pressure (0)
*               ! +------------  trans oil filter (1)
*               +--------------  trans oil pressure (1)
*****************************************************************
sensor   brclr   prgflg,#inproc+vlreq+hrreq+clreq+pgreq,99$
         rts                             eerom busy, update this later
99$      ldx     #regseg                                              [3]
         clra                                                         [2]
         clrb                                                         [2]
         brclr   dspctl+1,#bit0,1$       if english mode, skip         [6]
         sec                             1 = metric mode               [2]
1$       rolb
         rola
         brclr   addiag,#bit7,2$         if diagnostic mode inact, skip [6]
         sec                             1 = diag mode input high
2$       rolb
         rola
3$       rolb
         rola
4$       rolb
         rola
         brclr   portc,x,#backli,5$      if back lites off, skip       [7]
         sec
5$       rolb
         rola
         brclr   portc,x,#lftsvi,6$      if left turn input low, skip  [7]
         sec
6$       rolb
         rola
         brclr   portc,x,#rgtsvi,7$      if right turn input low, skip [7]
         sec
7$       rolb
         rola
         brclr   adhazz,#bit7,8$         if hazard input low, skip     [6]
         sec
8$       rolb
         rola
* beginning byte 2 here
         brclr   portc,x,#topsvi,9$      if tran oil pres inp. low, skip [7]
         sec
9$       rolb
         rola
         brclr   portc,x,#tofsvi,10$     if tran oil filt inp. low, skip [7]
         sec
10$      rolb
         rola
```

```
*\
        psha                    hyd lube pressure switch input
        pshb
        ldab    adlube          counts on this diag. switch input
        brclr   rmrefs,#bit4,102$
        jsr     scalsw          scale the switch, return normalized value
102$    cmpb    lubpop          if value < open threshold, CY = 1
        pulb
        pula
*/
*       brclr   adlube,#bit7,11$   if tran oil lev inp. low, skip   [6]
*       sec
11$     rolb
        rola
        brclr   portc,x,#airswi,12$  if air filter inp. low, skip   [7]
        sec
12$     rolb
        rola
        psha
        pshb
        ldab    adoilp
        brclr   rmrefs,#bit4,122$
        jsr     scalsw          scale the switch, return normalized value
122$    cmpb    oilpop
        pulb
        pula
*       brclr   adoilp,#bit7,13$   if eng oil pres inp. low, skip   [6]
*       sec
13$     rolb
        rola
14$     rolb
        rola
15$     rolb
        rola
16$     rolb
        rola
* all bits in D are in same format as status, now 'exclusive or' with mask
* in EEROM
        eora    s1mask          status byte 1 mask
        eorb    s2mask          status byte 2 mask

* done, now save and compare
        cpd     status                                              [4]
        beq     89$             no change from last, exit           [3]
        std     status          changed, store new as old           [4]
        clr     switmr          had a change, initiate a send       [6]
        brclr   dspflg,#bepbit,89$   if not beep mode, skip
        ldaa    #bepdly+1       cause a brief beep.
        staa    beptmr
89$     rts                                                         [5]
```

! All but these last 10 lines have read the 'current' switch pattern, the
! pattern is then compared with the 'last' status (pattern) and if a change
! in state occurred, and it is in BEEP MODE, then the beep timer is loaded
! with a value representing .25 seconds.

What is claimed is:

1. In a system having a plurality of devices, each device coupled to a central unit via a corresponding electrical cable, a method of detecting intermittent faults in the cables, the method comprising periodically performing the following steps while the cables are manually manipulated in sequence:
   a. generating and storing a first set of status signal representing electrical parameters of the cables;
   b. subsequently generating a second set of status signals representing electrical parameters of the cables;
   c. comparing the second set to the first set and generating an audible alarm signal if the second set differs from the first set, and
   d. replacing the first set with the second set.

2. A method for detecting intermittent faults in an electrical circuit having a plurality of devices, each connected to a central unit via a corresponding one of a plurality of conductors, the method comprising:
   a. storing in a memory a first set of status signals representing electrical parameters associated with the plurality of devices and communicated to the central unit via the conductors;
   b. storing a second set of status signals representing electrical parameters associated with the devices at a time subsequent to the storing of the first set of status signals;
   c. comparing the second set of status signals to the first set and generating an audible alarm signal if the sets differ from each other;
   d. redesignating the second set of status signals as the first set of status signals; and
   e. periodically repeating steps a. through d.

* * * * *